(12) United States Patent
Yokoyama (10) Patent No.: US 6,995,609 B2
(45) Date of Patent: Feb. 7, 2006

(54) SWITCHING CIRCUIT AND DIGITAL POWER AMPLIFIER

(75) Inventor: Kenji Yokoyama, Tokyo (JP)

(73) Assignee: Flying Mole Corporation (JP)

( * ) Notice: Subject to any disclaimer, the term of this patent is extended or adjusted under 35 U.S.C. 154(b) by 82 days.

(21) Appl. No.: 10/646,767

(22) Filed: Aug. 25, 2003

(65) Prior Publication Data

US 2004/0164792 A1 Aug. 26, 2004

(30) Foreign Application Priority Data

Aug. 28, 2002 (JP) .................................. 2002-248692

(51) Int. Cl.
*H03F 3/38* (2006.01)

(52) U.S. Cl. ..................... 330/10; 330/251; 330/291
(58) Field of Classification Search ............... 330/10, 330/251, 291
See application file for complete search history.

(56) References Cited

U.S. PATENT DOCUMENTS

| | | | | |
|---|---|---|---|---|
| 5,247,581 A | * | 9/1993 | Gurcan | ............ 381/321 |
| 6,118,337 A | | 9/2000 | Schweighofer | ............ 330/10 |
| 6,160,445 A | | 12/2000 | Schweighofer | ............ 330/10 |
| 6,172,558 B1 | | 1/2001 | Nowak et al. | ............ 330/10 |
| 6,175,272 B1 | * | 1/2001 | Takita | ............ 330/10 |
| 6,496,059 B1 | * | 12/2002 | Nguyen | ............ 330/10 |

FOREIGN PATENT DOCUMENTS

| | | |
|---|---|---|
| EP | 0 349 732 A1 | 1/1990 |
| JP | 56-58782 | 5/1981 |
| JP | 63-111710 | 5/1988 |
| JP | 6-216664 | 8/1994 |
| JP | 11-89242 | 3/1999 |
| JP | 2000-216642 | 8/2000 |

OTHER PUBLICATIONS

Robinson, 7th International Conf. on Power Electronics and Variable Speed Drives, London, Sep. 21–23, 1998, IEEE Conference Publication No. 456, pp. 606–611.
Steigerwald, IEEE, vol. 12, Jun. 18, 2000, pp. 643–648.
Nielsen, Journal of the Audio Engineering Society, Mar. 22, 1997, pp. 1–26.

* cited by examiner

*Primary Examiner*—Patricia Nguyen
(74) *Attorney, Agent, or Firm*—Lorusso & Loud (57) ABSTRACT

To provide a switching circuit and a digital power amplifier capable of supplying much power to a load, as compared with a conventional circuit.

A switching circuit of the present invention comprises a plurality of switching circuit units, in which first to fourth switching elements are connected in a loop in this order, having a DC power source, one end of which is connected to a node between the first and fourth switching elements, and the other end of which is connected to a node between the second and third switching elements. The plurality of switching circuit units are cascade-connected, with one of the external connection terminals of the switching circuit unit on the first stage being connected to one terminal of the load, and with the other of the external connection terminals of the switching circuit unit on the last stage being connected to the other terminal of the load.

In a digital power amplifier of the present invention, the switching circuit of the present invention is employed as the switching circuit.

5 Claims, 7 Drawing Sheets

SWITCHING CIRCUIT AND DIGITAL POWER AMPLIFIER

CROSS-REFERENCE TO RELATED APPLICATIONS

This application claims, under 35 USC 119, priority of Japanese Application No. 2002-248692 filed Aug. 28, 2002.

BACKGROUND OF THE INVENTION

1. Field of the Invention

The present invention relates to a switching circuit and a digital power amplifier, and more specifically, relates to a switching circuit and a digital power amplifier, in which a switching element having a small withstand voltage is employed for switching, so that high power can be supplied to a load.

2. Description of the Related Art

Recently, digitalization of amplifiers which amplify power is making quick progress. Particularly, in the audio amplifiers, digitalization is remarkably adopted in full scale. As equipment equipped with the digital power amplifier (a so-called switching amplifier), there can be mentioned DVD players, minicomponents, television sets, personal computers and portable telephones. This corresponds to the demand for miniaturizing audio amplifiers and achieving low power consumption, which arises as the equipment has high function.

In the switching amplifier, for example, two sets of series circuits consisting of two switching elements are connected between a pair of high and low power supply lines, and a load (speaker) and a low-pass filter are connected between nodes between the switching elements in the respective sets, so that the switching elements are on-off controlled according to a digital signal obtained by converting an acoustic signal, and the acoustic signal returned to an analog signal again by the low-pass filter is supplied to the load.

In audio amplifiers of the analog amplifier, amplifiers having the output power of 1 kW or higher exist at present. On the other hand, in the audio amplifiers employing the digital power amplifier (switching amplifier), the output power thereof is generally from 200 to 300 W.

It is desired that the switching amplifier have high output as high as being capable of realizing an analog amplifier, taking into consideration that the switching amplifier is replaced for an analog amplifier.

However, the conventional switching amplifier has a switching element as an essential component, and the withstand voltage in the switching element restricts the output power, and hence the upper limit of the output power has been from 200 to 300 W.

Therefore, there is a demand for a switching circuit and a digital power amplifier capable of supplying much power to the load, as compared with the conventional circuit.

SUMMARY OF THE INVENTION

In order to solve the above problems, the switching circuit according to a first aspect of the present invention comprises: N (N is an integer of at least 2) switching circuit units, in which first to fourth switching elements are connected in a loop in this order, having a DC power source, one end of which is connected to a node between the first and fourth switching elements, and the other end of which is connected to a node between the second and third switching elements, wherein a node between the first and second switching elements in the switching circuit unit on the n-th stage (n is from 2 to N) is connected to a node between the third and fourth switching elements in the switching circuit unit on the (n−1)th stage; a node between the first and second switching elements in the switching circuit unit on the first stage is connected to one terminal of a load, and a node between the third and fourth switching elements in the switching circuit unit on the N-th stage is connected to the other terminal of the load, and the first and third switching elements in all of the switching circuit units are switched on or off in response to a first on-off control signal, and the second and fourth switching elements in all of the switching circuit units are switched on or off in response to a second on-off control signal, which is in a complementary relation with the first on-off control signal.

A digital power amplifier according to a second aspect of the present invention comprising: a PWM modulation circuit which converts an input analog signal to a positive-phase or negative-phase PWM signal, and has a configuration for compensating the conversion characteristic corresponding to a feedback signal; a switching circuit having a plurality of switching elements for controlling the power supply from a DC power source to a load in a forward direction or a reverse direction by switching; a driver section having a first driver to which the positive-phase PWM signal is input, and a second driver to which the negative-phase PWM signal is input, which respectively on-off drive a predetermined switching element in the switching circuit, corresponding to the positive-phase or negative-phase PWM signal; and a feedback circuit which feeds back the power supply condition to the load to the PWM modulation circuit, wherein a switching circuit according to the first aspect of the present invention is employed as the switching circuit, and an isolation driver which electrically isolates the switching circuit from the PWM modulation circuit side is employed as the first and second drivers in the driver section.

DETAILED DESCRIPTION OF THE PREFERRED EMBODIMENTS (A) First Embodiment

A first embodiment of the switching circuit and the digital power amplifier according to the present invention will be described in detail, with respect to the drawings.

Figure 1:
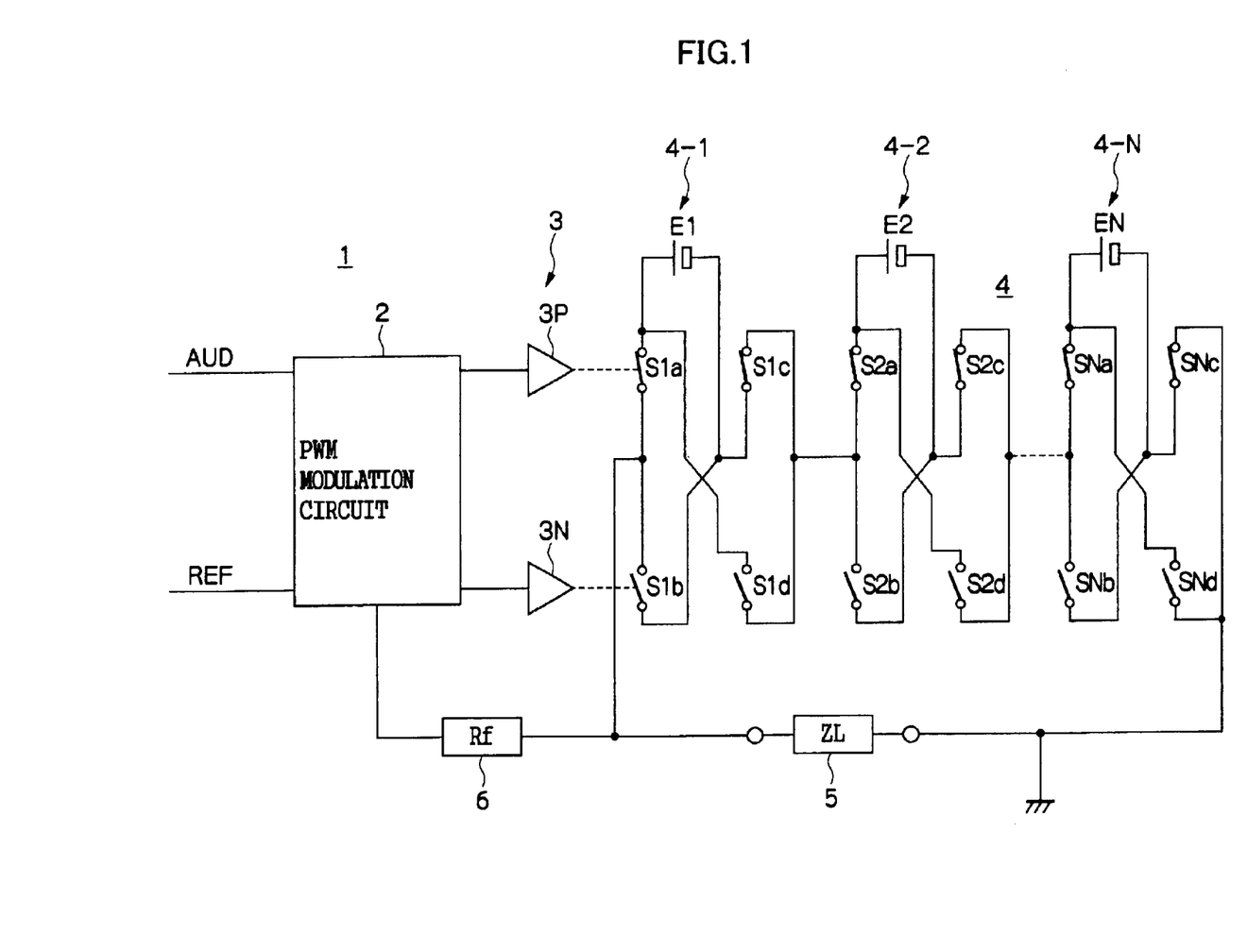
FIG. 1 is a block diagram showing the schematic configuration of a digital power amplifier in a first embodiment.

FIG. 1 is a block diagram showing a conceptual structure of the digital power amplifier in the first embodiment.

In FIG. 1, a digital power amplifier 1 in the first embodiment has a PWM modulation circuit 2, a driver section 3, a BTL (Bridged Transless) type switching circuit 4, a load (ZL) 5 and a feedback circuit 6.

To the PWM modulation circuit 2 are input an input audio signal AUD, and for example a triangular wave signal REF, which becomes a comparison standard. The PWM modulation circuit 2 amplifies the input audio signal AUD in an analog manner, and then converts the input audio signal AUD to complementary PWM signals (positive-phase and negative-phase PWM signals), by the comparison processing with the triangular wave signal REF. Needless to say, the positive-phase and negative-phase PWM signals are one-bit digital signals, respectively.

The BTL type switching circuit 4 is obtained by cascade (concatenated) connecting N BTL switching circuit units 4-1 to 4-N (N is an integer of at least 2), in the manner described later.

The respective switching circuit units 4-n (n is from 1 to N) has, for example, first to fourth switching elements Sna to Snd consisting of an MOSFET, and a DC power source En.

A positive terminal of the DC power source En is connected to the current introducing side terminal of the first and the fourth switching elements Sna and Snd, and a negative terminal of the DC power source En is connected to the current deriving side terminal of the second and the third switching elements Snb and Snc. Moreover, the current deriving side terminal of the first switching element Sna is connected to the current introducing side terminal of the second switching element Snb, and the current introducing side terminal of the third switching element Snc is connected to the current deriving side terminal of the fourth switching element Snd.

A node between the current deriving side terminal of the first switching element Sna and the current introducing side terminal of the second switching element Snb becomes a node with a switching circuit unit 4-(n−1) on the former stage ((n−1)th stage), and a node between the current introducing side terminal of the third switching element Snc and the current deriving side terminal of the fourth switching element Snd becomes a node with a switching circuit unit 4-(n+1) on the latter stage ((n+1)th stage).

A node between the current introducing side terminal of the first switching element S1a and the current deriving side terminal of the second switching element S1b, in the switching circuit unit 4-1 on the first stage, is connected to one terminal of a load 5, and a node between the current introducing side terminal of the third switching element SNc and the current deriving side terminal of the fourth switching element SNd in the switching circuit unit 4-N on the last stage (N-th stage) is connected to the other terminal of the load 5. The other terminal of the load 5 is grounded.

The first switching elements S1a to SNa and the third switching elements S1c to SNc in the switching circuit units 4-1 to 4-N on all stages are on-off controlled by a positive-phase driver 3P in the driver section 3. Similarly, the second switching elements S1b to SNb and the fourth switching elements S1d to SNd in the switching circuit units 4-1 to 4-N on all stages are on-off controlled by a negative-phase driver 3N in the driver section 3.

The driver section 3 has the positive-phase driver 3P and the negative-phase driver 3N, as described above. The both drivers 3P and 3N respectively comprise an isolation driver having an electrically isolating configuration, for example, one utilizing a photo-coupler, a transformer and an optical fiber in a part thereof. Since the positive-phase and the negative-phase PWM signals, being an input, are one-bit digital signals, for both the drivers 3P and 3N, one operating at a high speed can be employed.

The positive-phase driver 3P on-off controls the switching elements S1a to SNa and S1c to SNc, which are objects to be driven, corresponding to the positive-phase PWM signal from the PWM modulation circuit 2, and the negative-phase driver 3N on-off controls the switching elements S1b to SNb and S1d to SNd, which are objects to be driven, corresponding to the negative-phase PWM signal from the PWM modulation circuit 2.

Figure 2:
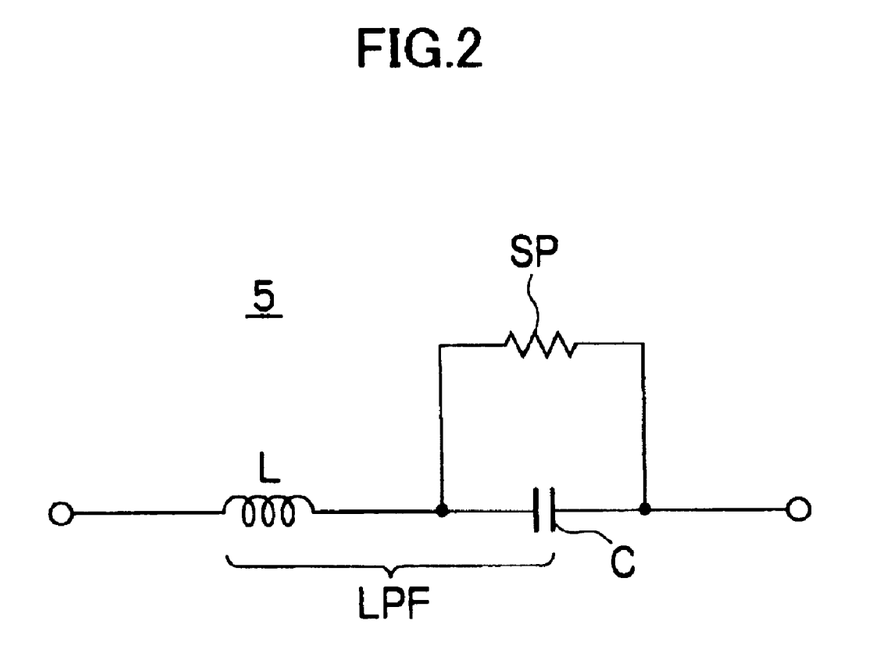
FIG. 2 is a circuit diagram inside a load in the first embodiment.

For example as shown in FIG. 2, the load 5 comprises a low-pass filter LPF (L and C) and a load body (speaker) SP, wherein the forward or reverse current by the switching circuit 4 is re-converted to an analog audio signal by the low-pass filter LPF, to drive the load body (speaker) SP.

Figure 3:
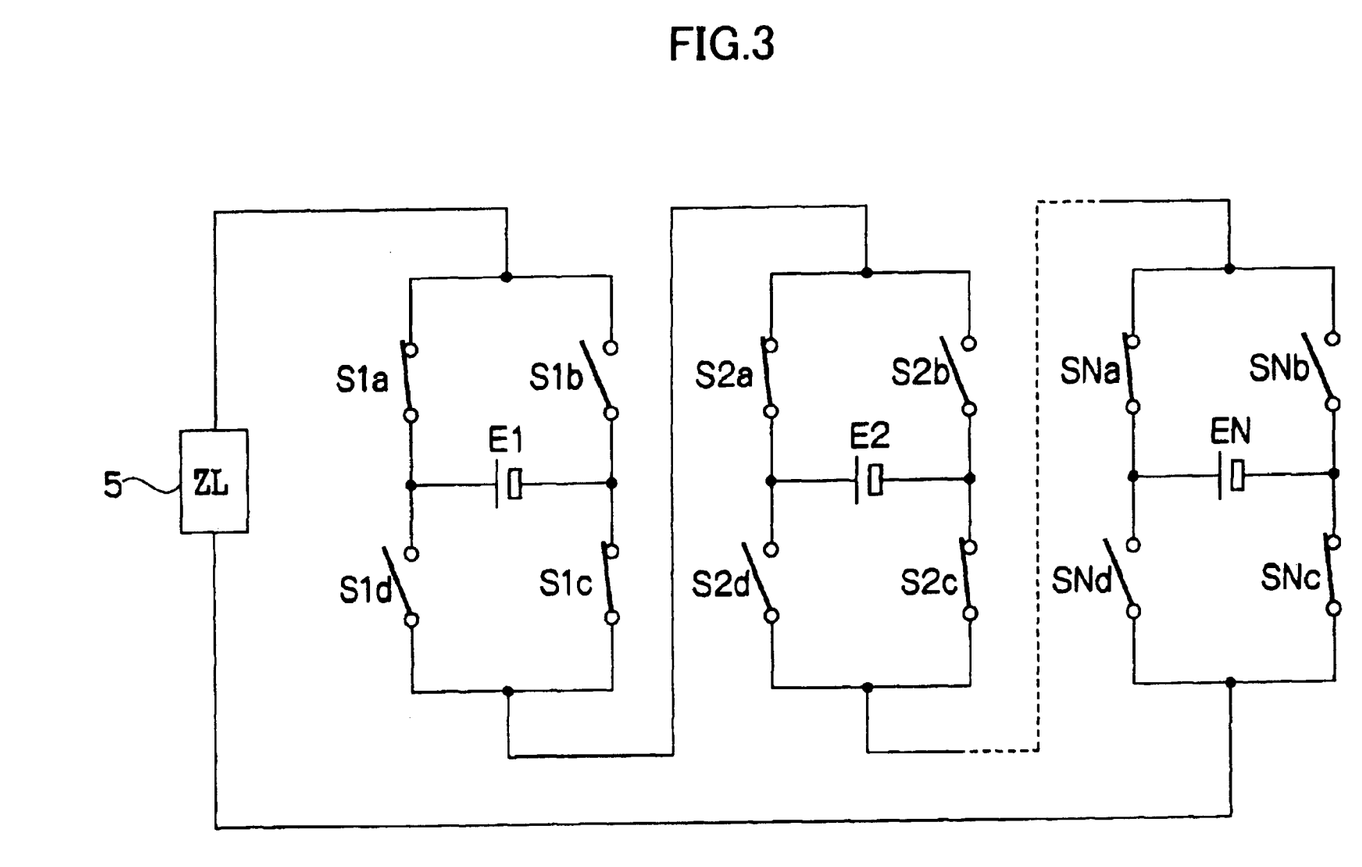
FIG. 3 is a block diagram in which the configuration of the switching circuit in FIG. 1 is rewritten from another aspect.

FIG. 3 is obtained by rewriting the part of the BTL type switching circuit 4 and the load 5 in FIG. 1 for reference. The substantial connection is the same as that shown in FIG. 1. The scope of claims is expressed corresponding to the description in FIG. 3.

The feedback circuit 6 is for feeding back the transfer characteristic (phase, level and the like) to the load 5 to the PWM modulation circuit 2 (for example, to the analog amplifier portion thereof).

In the case of the first embodiment, 2×N switching elements S1a to SNa and S1c to SNc, or S1b to SNb and S1d to SNd, the number of which is more than that of the conventional circuit, exist in the current path to the load 5, with either one switched on. For the respective switching elements S1a to SNa, S1c to SNc, S1b to SNb and S1d to SNd, the one of the same standard is employed. However, due to a difference in products, the on-resistance in the respective switching elements S1a to SNa, S1c to SNc, S1b to SNb and S1d to SNd may be different, and hence the transfer characteristic may be changed from the desired transfer characteristic. Therefore, by feeding back the transfer characteristic via the feedback circuit 6, the transfer characteristic as a whole is stabilized.

The switching circuit 4 operates, using the earth potential as a low power supply potential, as shown in FIG. 1. On the other hand, in the PWM modulation circuit 2, for example, an operational amplifier is employed for the internal analog amplifier and comparator, and the PWM modulation circuit 2 operates by the positive and negative power supply, and the reference potential is different from that of the switching circuit 4. Therefore, when a driver other than a driver having an electrically isolating configuration is used for the positive-phase driver 3P and the negative-phase driver 3N, the operation may not be stabilized due to the difference in the reference potential.

Therefore, a driver having an electrically isolating configuration (isolation driver) is used for the positive-phase driver 3P and the negative-phase driver 3N.

In general, not many of the isolation drivers (for example, a photocoupler) for driving an analog signal operate at a high speed. In the first embodiment, however, since one-bit digital signal (PWM signal) is driven, the isolation driver operating at a high speed is readily available, and hence, the operation speed of the positive-phase driver 3P and the negative-phase driver 3N does not become a problem.

Also in the first embodiment, the basic operation of the PWM modulation circuit 2 and the driver section 3, and the function of the feedback circuit 6 are the same as those in the conventional circuit.

The outline of current supply (power supply) to the load by the BTL type switching circuit 4 will be described below.

As described above, the switching elements S1a to SNa and S1c to SNc are on-off controlled corresponding to the positive-phase PWM signal by the positive-phase driver 3P, and the switching elements S1b to SNb and S1d to SNd are on-off controlled corresponding to the negative-phase PWM signal by the negative-phase driver 3N.

Therefore, when the switching elements S1a to SNa and S1c to SNc are switched on (closed), the switching elements S1b to SNb and S1d to SNd are switched off (opened), and on the contrary, when the switching elements S1b to SNb and S1d to SNd are switched on (closed), the switching elements S1a to SNa and S1c to SNc are switched off (opened).

Figure 4:
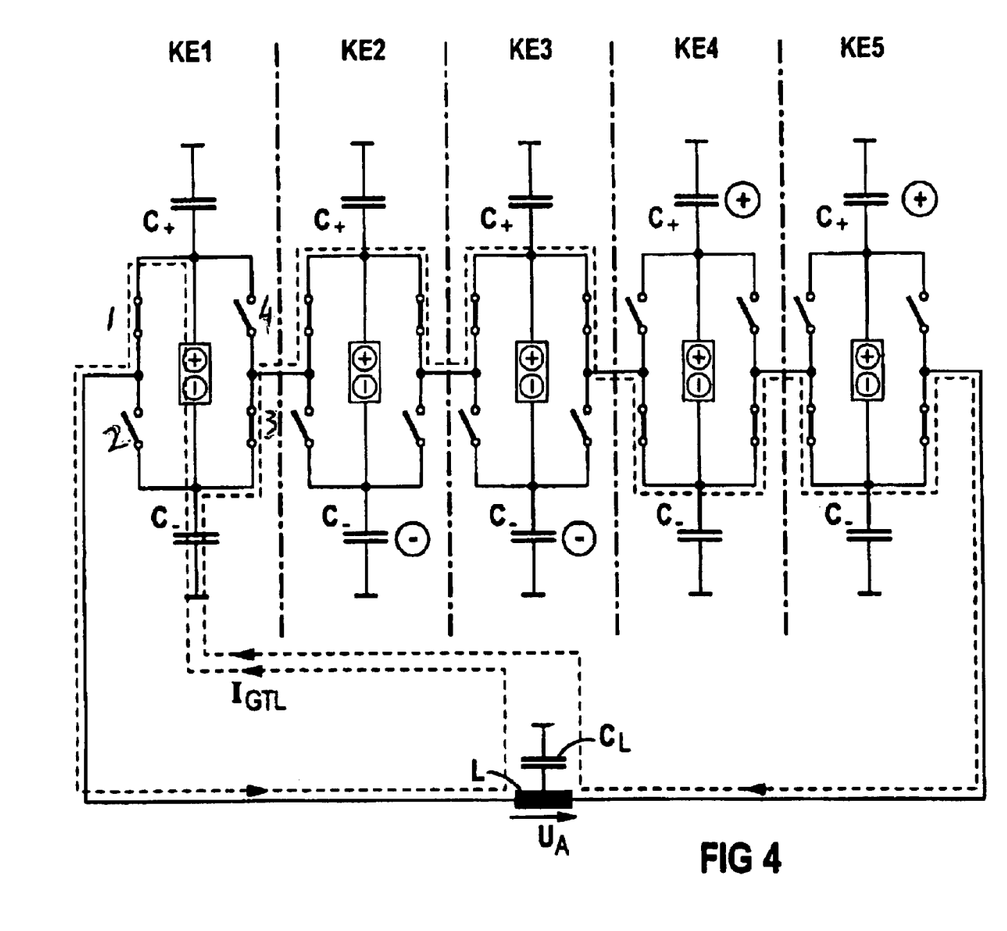
FIG. 4 is a diagram showing a positive-phase-sequence current path in the switching circuit in FIG. 1.
Figure 5:
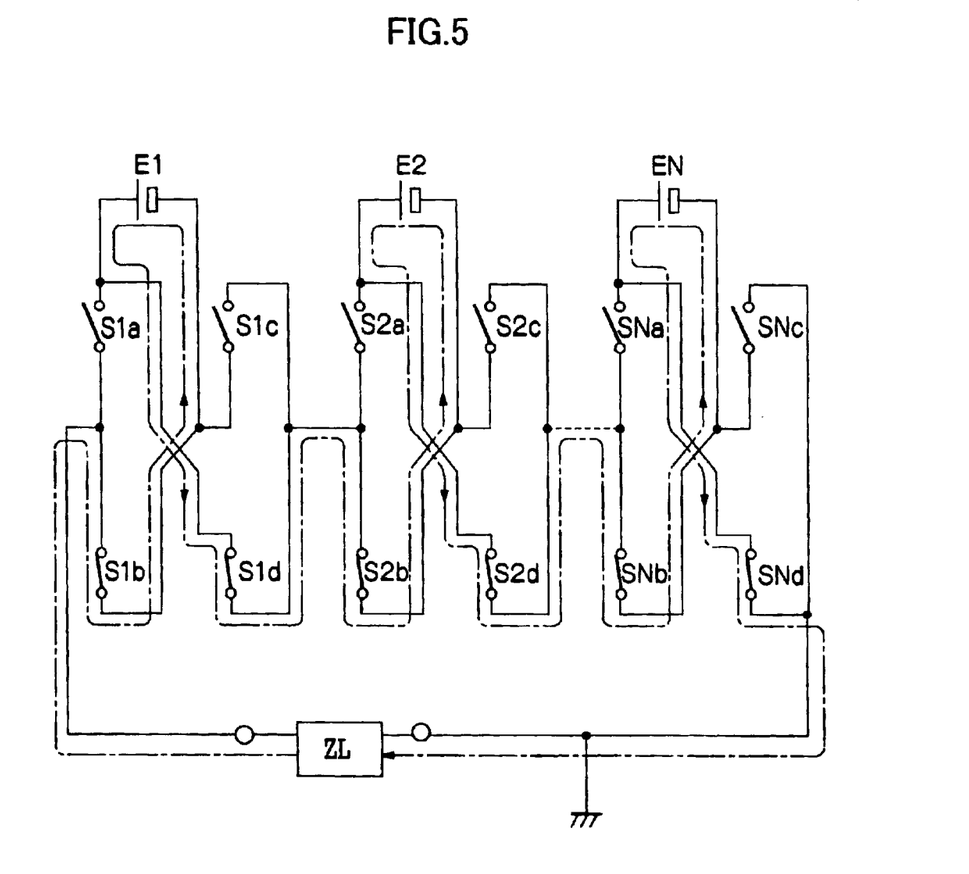
FIG. 5 is a diagram showing a negative-phase-sequence current path in the switching circuit in FIG. 1.

FIG. 4 shows the current path to the load in the former case (one-dot chain line), and FIG. 5 shows the current path to the load in the latter case (one-dot chain line).

When the switching elements S1a to SNa and S1c to SNc are switched on, as shown in FIG. 4, the respective DC power sources E1 to EN are connected in series, and currents by the respective DC power sources E1 to EN are combined, and flow in the forward direction with respect to the load 5. Moreover, as seen from the load 5, combined voltage of the DC power sources E1 to EN is applied in the forward direction.

However, since the switching elements S1a to SNa and S1c to SNc are respectively located at positions between the DC power sources E1, . . . , and EN, appropriately, the applied voltage to the switching elements S1a to SNa and S1c to SNc is not the combined voltage by the DC power sources E1 to EN, but the voltage by the individual DC power source E1, . . . , or EN.

Similarly, when the switching elements S1b to SNb and S1d to SNd are switched on, as shown in FIG. 5, the respective DC power sources E1 to EN are connected in series, and the currents by the respective DC power sources E1 to EN are combined, and flow in the reverse direction with respect to the load 5. Moreover, as seen from the load 5, combined voltage of the DC power sources E1 to EN is applied in the reverse direction.

However, also in this case, since the switching elements S1b to SNb and S1d to SNd are respectively located at positions between the DC power sources E1, . . . , and EN, appropriately, the applied voltage to the switching elements S1b to SNb and S1d to SNd is not the combined voltage by the DC power sources E1 to EN, but the voltage by the individual power source E1, . . . , or EN.

According to the first embodiment, since the BTL type switching circuit is constituted by the cascade connection of a plurality of BTL type switching circuit units, as described above, it is also possible to increase the supply power to the load considerably as compared with the conventional circuit. As a result, a high-output digital power amplifier can be realized.

By selecting the number of the cascade-connected BTL type switching circuit units, desired output power can be easily obtained.

Even if the supply power to the load is increased, the applied voltage to the respective switching elements can be suppressed to about one portion of the DC power source. As a result, even if a switching element having a small withstand voltage is used, the above-described effect can be obtained.

Moreover, even if the number of switching elements interposed in the power supply path to the load increases as compared with the conventional circuit, since the transfer characteristic is fed back to the PWM modulation circuit via a feedback circuit, and an isolation driver is employed for a driver which drives the switching elements corresponding to the output signal (one-bit digital signal) from the PWM modulation circuit, excellent transfer characteristic can be obtained.

(B) Second Embodiment

A second embodiment of the switching circuit and the digital power amplifier according to the present invention will be briefly described, with respect to the drawings.

Figure 6:
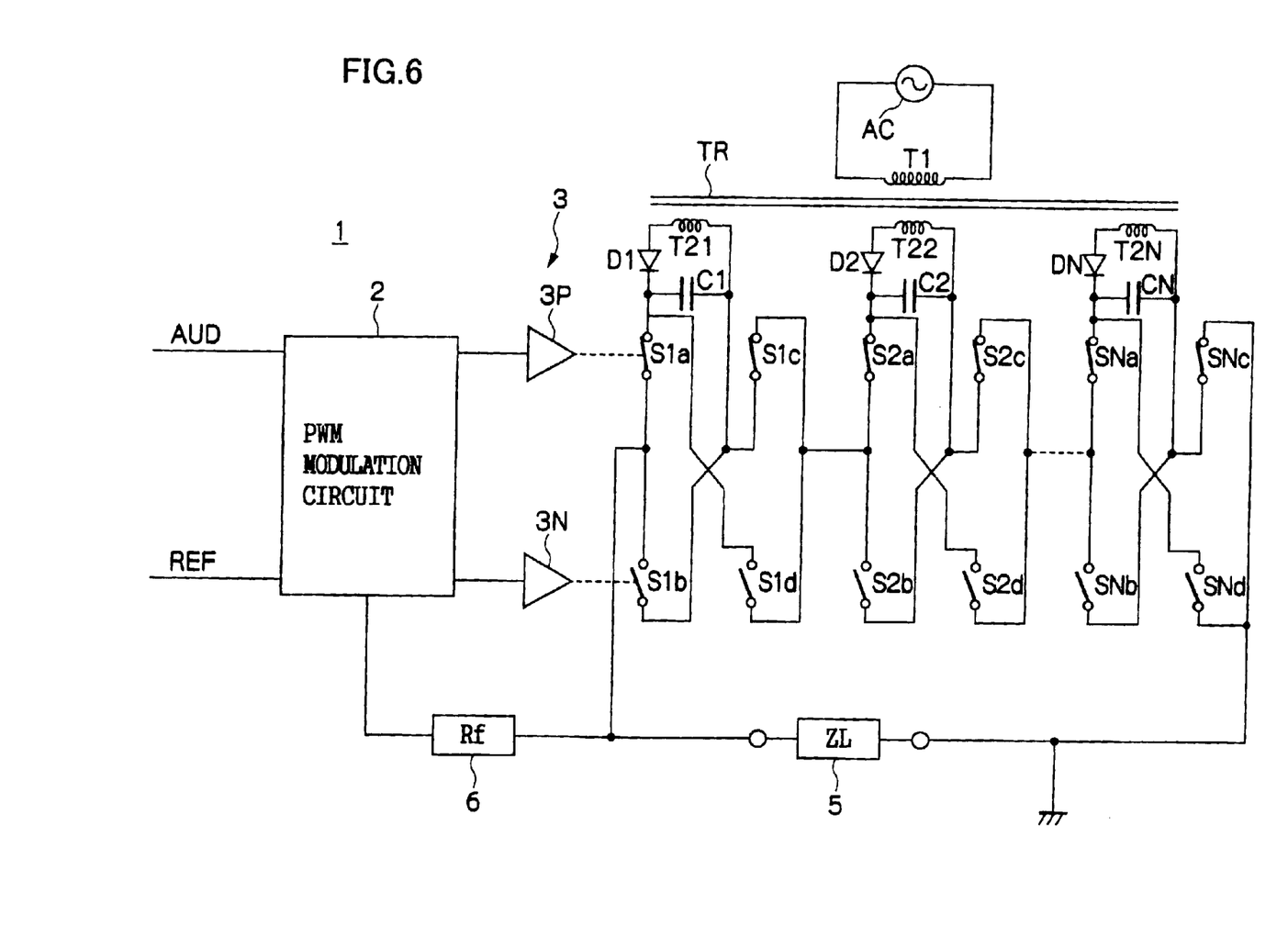
FIG. 6 is a block diagram showing the schematic configuration of a digital power amplifier in a second embodiment.

FIG. 6 is a block diagram showing a schematic configuration of the digital power amplifier in the second embodiment, wherein the same or corresponding parts as those in FIG. 1 according to the first embodiment are denoted by the same reference symbols.

In the first embodiment, DC power sources E1 to EN in the switching circuit units 4-1 to 4-N have been described in an image of a battery.

In the second embodiment, as shown in FIG. 6, the DC power sources (E1 to EN) in the switching circuit units 4-1 to 4-N are formed by an alternating current power source (for example, commercial power supply) AC.

In other words, the alternating current power AC is applied to a primary winding T1 of a transformer TR having secondary windings of a number for the switching circuit units 4-1 to 4-N on the secondary side, to rectify the electromotive voltage induced by the respective secondary windings T21 to T2N by diodes D1 to DN, and smooth the rectified output by smoothing capacitors C1 to CN, so that the DC power sources (E1 to EN) in the switching circuit units 4-1 to 4-N are formed.

According to the second embodiment, in addition to the effect by the first embodiment, there is the effect that the AC power source (for example, commercial power supply) can be used as the initial power source.

(C) Third Embodiment

A third embodiment of the switching circuit and the digital power amplifier according to the present invention will be briefly described, with respect to the drawings.

Figure 7:
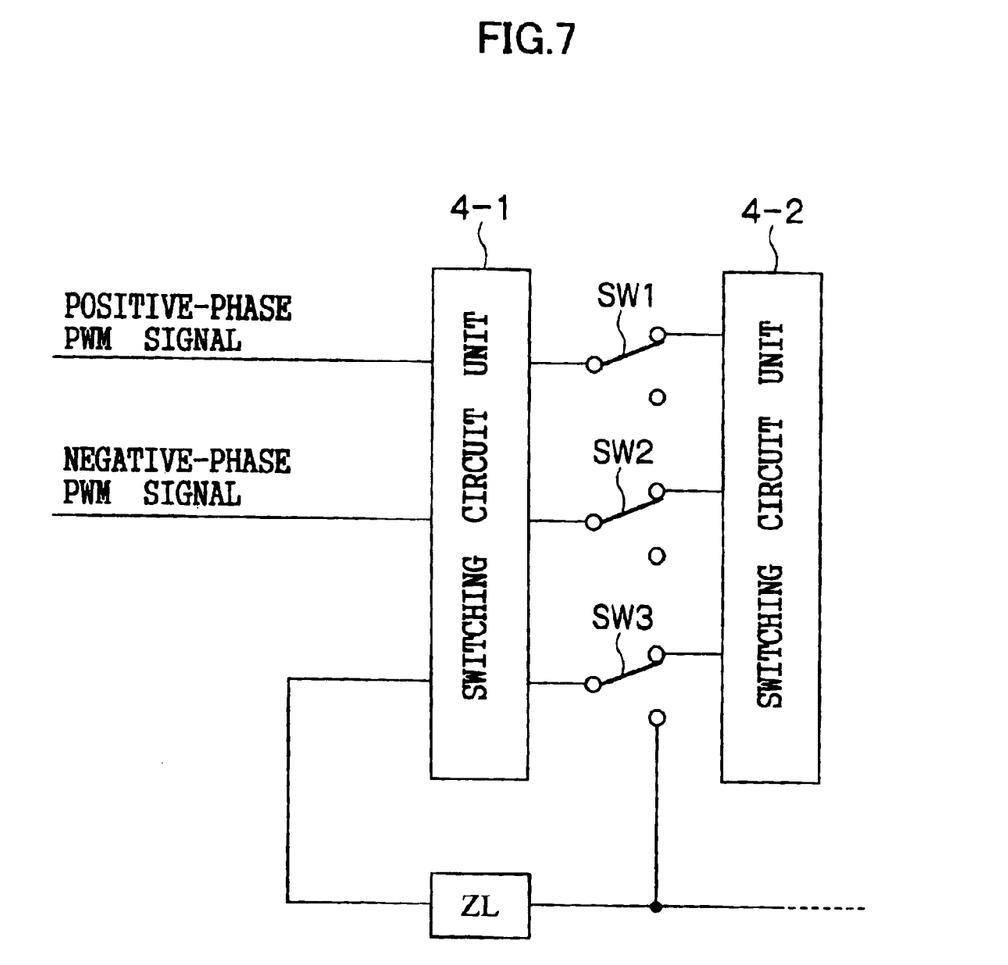
FIG. 7 is a diagram showing the main part of a third embodiment.

FIG. 7 is a block diagram showing the main configuration of the digital power amplifier in the third embodiment, wherein the same or corresponding parts as those in FIG. 1 according to the first embodiment are denoted by the same reference symbols. FIG. 7 shows the peripheral configuration around the switching circuit units 4-1 and 4-2 on the first and second stages.

In the third embodiment, the switching circuit units 4-2 to 4-N on the second to the N-th stages are respectively formed of one printed board, and are detachable with respect to the motherboard. A detachable detection structure (not shown) is provided on the motherboard side (or on the printed board to be detached). By the detection result thereof, switches SW1 and SW2 shown in FIG. 7 (for example, mechanical switches) control supply or non-supply of the driver output between the switching circuit units 4-1 and 4-2, and a switch SW3 controls connection between the switching circuit units 4-1 and 4-2, or connection between the switching circuit unit 4-1 and one terminal of the load 5. A similar processing structure is provided for detachment of the switching circuit unit 4-2 and thereafter.

According to the third embodiment, in addition to the effect of the first embodiment, there is the effect that the number of the switching circuit units can be easily changed.

(D) Other Embodiments

In the description of the respective embodiments, the relation between the voltage values of the respective DC power sources E1 to EN has not been referred to, but all the voltage values may be equal, or all or a part of the voltage values may be different.

The present invention has a feature in the configuration of the switching circuit, and the PWM modulation circuit 2, the driver section 3 and the feedback circuit 6 having any configuration may be used.

The application of the switching circuit according to the present invention is not limited to the digital power amplifier, and the switching circuit is applicable to various apparatus requiring a switching circuit.

As described above, according to the switching circuit and the digital power amplifier of the present invention, the switching circuit is constituted of a plurality of switching circuit units comprising four switching elements and DC power sources, which are connected by cascade connection. As a result, it is possible to increase the supply power to the load considerably as compared with the conventional circuit, without increasing the withstand voltage of the switching elements, and desired output power can be easily obtained by selecting the number of switching circuit units.

What is claimed is:

1. A switching circuit comprising:

N (N is an integer of at least 2) switching circuit units, each having first to fourth switching elements connected in a loop in this order, and a DC power source, one end of which is connected to a node between said first and fourth switching elements, and the other end of which is connected to a node between said second and third switching elements, wherein a node between said first and second switching elements in said switching circuit unit on the n-th stage (n is from 2 to N) is connected to a node between said third and fourth switching elements in said switching circuit unit on the (n−1)th stage, a node between said first and second switching elements in said switching circuit unit on the first stage is connected to one terminal of a load, and a node between said third and fourth switching elements in said switching circuit unit on the N-th stage is connected to the other terminal of the load, said first and third switching elements in all of said switching circuit units are switched on or off in response to a first on-off control signal, and said second and fourth switching elements in all of said switching circuit units are switched on or off in response to a second on-off control signal, which is in a complementary relation with said first on-off control signal, and said DC power source in each of said switching circuit units comprises respective secondary windings in a transformer having one primary winding to which AC power is applied and N secondary windings, and rectifying and smoothing means for rectifying and smoothing induced electromotive voltage of the secondary windings.

2. The switching circuit according to claim 1, wherein all or a part of said switching circuit units is detachably provided.

3. A digital power amplifier comprising:

a PWM modulation circuit which converts an input analog signal to a positive-phase or negative-phase PWM signal, and has a configuration for compensating a conversion characteristic corresponding to a feedback signal;

a switching circuit having a plurality of switching elements for controlling the power supply from a DC power source to a load in a forward direction or a reverse direction by switching;

a driver section having a first driver to which said positive-phase PWM signal is input, and a second driver to which said negative-phase PWM signal is input, which respectively on-off drive a predetermined switching element in said switching circuit, corresponding to said positive-phase or negative-phase PWM signal; and a feedback circuit which feeds back the power supply condition to said load to said PWM modulation circuit, wherein said switching circuit includes N (N is an integer of at least 2) switching circuit units, each having first to fourth switching elements connected in a loop in this order, and a DC power source, one end of which is connected to a node between said first and fourth switching elements, and the other end of which is connected to a node between said second and third switching elements, wherein a node between said first and second switching elements in said switching circuit unit on the n-th stage (n is from 2 to N) is connected to a node between said third and fourth switching elements in said switching circuit unit on the (n−1)th stage, a node between said first and second switching elements in said switching circuit unit on the first stage is connected to one terminal of a load, and a node between said third and fourth switching elements in said switching circuit unit on the N-th stage is connected to the other terminal of the load, and said first and third switching elements in all of said switching circuit units are switched on or off in response to a first on-off control signal, and said second and fourth switching elements in all of said switching circuit units are switched on or off in response to a second on-off control signal, which is in a complementary relation with said first on-off control signal, and an isolation driver which electrically isolates said switching circuit from said PWM modulation circuit side is employed as said first and second drivers in said driver section.

4. The switching circuit according to claim 3, wherein all or a part of said switching circuit units is detachably provided.

5. The switching circuit according to claim 3, wherein said DC power source in each of said switching circuit units comprises respective secondary windings in a transformer having one primary winding to which AC power is applied and N secondary windings, and rectifying and smoothing means for rectifying and smoothing induced electromotive voltage of the secondary windings.

* * * * *